United States Patent [19]

Smith et al.

[11] 4,364,078
[45] Dec. 14, 1982

[54] EDGE BARRIER OF POLYSILICON AND METAL FOR INTEGRATED CIRCUIT CHIPS

[75] Inventors: Paul W. Smith, San Jose; James J. Freeman, Milpitas; Donald D. Forsythe, Palo Alto; Megha Shyam, Santa Clara; Kenneth K. Yagura, Sunnyvale; Gunnar Wetlesen, Los Gatos, all of Calif.

[73] Assignee: Synertek, Santa Clara, Calif.

[21] Appl. No.: 150,439

[22] Filed: May 16, 1980

Related U.S. Application Data

[63] Continuation of Ser. No. 933,895, Aug. 15, 1978, abandoned, which is a continuation of Ser. No. 768,274, Feb. 14, 1977, abandoned.

[51] Int. Cl.³ .......................................... H01L 29/34
[52] U.S. Cl. .................................. 357/52; 357/54; 357/59
[58] Field of Search ........................... 357/52, 54, 59

[56] References Cited

U.S. PATENT DOCUMENTS

| | | | |
|---|---|---|---|
| 4,012,762 | 3/1977 | Abe et al. | 357/54 |
| 4,080,619 | 3/1978 | Suzuki | 357/52 |
| 4,114,254 | 9/1978 | Aoki et al. | 357/59 |

Primary Examiner—Joseph E. Clawson, Jr.
Attorney, Agent, or Firm—Thomas Schneck

[57] ABSTRACT

An aluminum over silicon barrier extends over the lateral edges of an integrated circuit chip into adjacent scribe lines forming an edge barrier.

4 Claims, 13 Drawing Figures

EDGE BARRIER OF POLYSILICON AND METAL FOR INTEGRATED CIRCUIT CHIPS

This is a continuation of application Ser. No. 933,895, filed Aug. 15, 1978, which was a continuation of application Ser. No. 768,274 filed on Feb. 14, 1977, both abandoned.

BACKGROUND OF THE INVENTION

A. Field of the Invention

The invention relates to integrated circuit construction, and more particularly to an integrated circuit boundary or edge construction and method of assembly.

B. Prior Art

In the construction of integrated circuits, it is customary that tens, or more typically hundreds, of integrated circuits are produced on a single circular wafer of silicon, usually two, three or four inches in diameter. Each integrated circuit is rectangular, having a dimension on the order of one quarter inch on a side. Between integrated circuits is a scribing line, where a diamond saw or diamond scribe or laser scribe cuts the wafer into individual integrated circuits known as die. In each wafer, there are some dice which do not operate properly. The percentage of operable circuits per wafer determine the yield of the manufacturing process. To increase productivity, it is desirable to enhance yield.

Besides the problem of yield, another problem of concern to integrated circuit manufacturers is the reliability of packaged circuits. The dice, once they are cut from a wafer, are mounted on ceramic or metal substrates and covered with a ceramic or plastic housing. For example, when a ceramic housing is provided, known as "cerdip" package, an acronym for "ceramic dual-in-line" package, one process requires high temperature to achieve proper sealing of the housing to the substrate which holds the integrated circuit. Typically, a sealing temperature of 480° C. for approximately nine minutes is used. Such a high temperature enhances ion mobility from lateral edges to within or near the integrated circuit, sometimes causing contaminant ions lodged along the scribing line to be injected into active portions of the integrated circuit, somewhat resembling an unwanted process step wherein contaminants migrate into the circuit. This migration is not limited to high temperature seals or particular package types, but occurs to an extent in all packages.

Previously, the lateral edges of the integrated circuit included exposed layers of oxide and perhaps other materials and the interfaces between these layers which were transparent to mobile ions and other contaminants which could migrate into active areas of the circuit.

In certain prior art integrated circuit constructions channel guards have been used to isolate active circuit areas, as in U.S. Pat. Nos. 3,808,058 and 3,559,283. Also, glass layers have been used to encapsulate integrated circuits, as in U.S. Pat. No. 3,706,129. Also, barriers to retard field inversions have been provided. Yet none of these structures adequately stops contaminant migration.

It is our object to increase integrated circuit chip reliability by decreasing failure modes due to ion migration from within or upon scribe line areas into active circuit regions and perhaps other causes. Another object is to improve the yield of operable integrated circuits cut from a wafer.

SUMMARY OF THE INVENTION

The above objects are achieved by providing a protective barrier over the side wall perimeter of the dice before scribing or cutting. In the preferred embodiment a two-part contiguous edge barrier which extends to all lateral edges of an integrated circuit chip above the substrate has been found to be advantageous. The two-part barrier includes the lower part which is generally impervious to ionic contaminants and a second part, layered over the first part.

The two-part barrier structure of the present invention isolates ionic contaminants as well as other contaminants from migrating to active circuit regions, thereby improving yield and reliability of integrated circuit chips. The active circuit regions are defined as locations wherein electrical conduction occurs within the diode or the transistor.

We have found that a deposited silicon layer works ideally for the first or lower barrier layer, while an aluminum layer works well for the second or upper barrier layer.

DESCRIPTION OF THE PREFERRED EMBODIMENT

Figure 1:
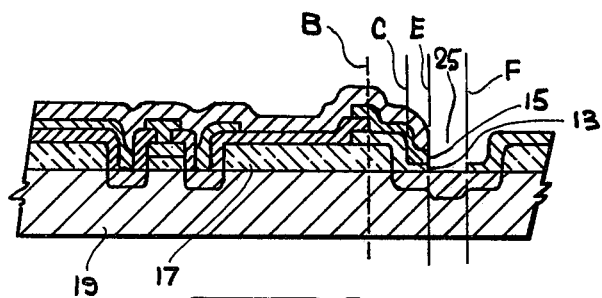
FIG. 1 is a side sectional view showing an edge of an integrated circuit chip, extending to the edge of a scribe line.

FIG. 1 shows the barrier of the present invention in a side view. In practice, the barrier extends completely around an integrated circuit chip without any break from the substrate upwardly, as well as downwardly. The two-layer barrier of the present invention typically extends from the edge, indicated by line E, of a scribe line where the integrated circuit is cut, past the edge of the integrated circuit chip, indicated by line C, slightly into the body of the chip indicated by line B. Typically, the distance between lines E and C is approximately 6 micrometers, and the distance between lines C and B is typically 6 micrometers. An aluminum member of the barrier should, but need not necessarily, extend inwardly or to the left beyond line B. A deposited silicon member of the barrier must extend inwardly or to the left beyond line B to insure that the polysilicon edge is not exposed as a result of misalignment at the contact mask. The construction of the members will be described below.

The barrier structure of the present invention has a lower member 13 which is a layer of material which is impervious to contaminants in general, specifically, impervious to ionic contaminants and is facing scribe line 25.

A second barrier member, 15, also facing scribe line 25, is disposed on top of the first barrier member 13 and is made of a material which may be impervious to nonionic contaminants, but is transparent to ionic contaminants. We have found a polysilicon to be suitable for the first member 13 and aluminum to be suitable for the second member 15.

In operation, the first barrier member 13 physically excludes contaminants, especially ionic contaminants from migrating toward the thermal oxide layer 17 wherein such ionic contaminants could easily migrate toward active circuit areas.

The second barrier member, 15, also excludes ionic contaminants. Although the mechanism is not understood, the second barrier member may remove contaminants from the vicinity of the thermal oxide 17 and from the vicinity of active circuit areas by conducting ionic contaminants upward and distal from the active circuit areas. The two-part barrier structure works better than a single barrier alone.

The thermal oxide 17 resides over a silicon substrate 19 wherein active circuit areas are deposited. To the right of the scribe line edge represented by line F is another integrated circuit having a protective barrier identical to the barrier described to the left of the scribe line edge represented by line E. In fact, a wafer has an array of integrated circuit chips, each chip or die being completely surrounded by the barrier structure of the present invention.

The vertical thickness of the first barrier member 13, is approximately 0.5 micrometers while the second member 15, is approximately 1.0 micrometers thick. These dimensions are not critical, but are selected for convenience in the manufacturing process which is described below. For other manufacturing processes, the barrier heights may differ, without departing from the spirit of this invention.

Figure 2:
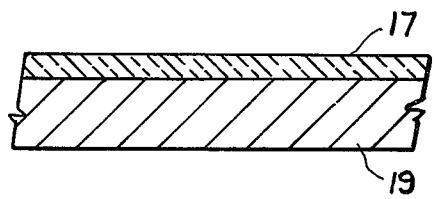
FIG. 2 is a side sectional view of a first or thermal oxide step in the construction of the apparatus of FIG. 1.

With reference to FIG. 2, the barrier structure of the present invention is constructed at the same time as other protions of an integrated circuit, including active circuit regions. A complete integrated circuit chip is not shown, only that portion which is proximate to a scribe line.

With reference to FIG. 2, a substrate of monocrystalline silicon 19, approximately 0.015 inches thick is provided over which a layer of thermal oxide 17 is provided. Oxide layer 17 is approximately 1.0 micrometers in vertical thickness.

Figure 3:
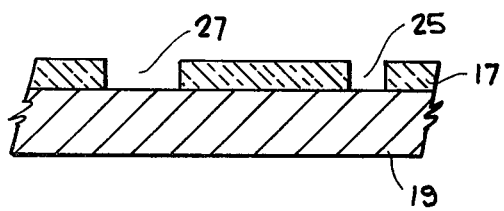
FIG. 3 is a side sectional view of a first masking step utilized in the construction of the apparatus of FIG. 1.

In FIG. 3, a first masking process allows definition of the scribe line 25 through oxide 17 as well as definition of other regions such as the gate and device area 27.

Figure 4:
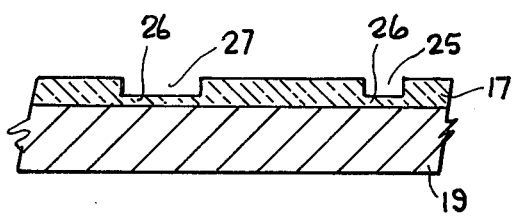
FIG. 4 is a side sectional view of a gate oxidation step used in the construction of the apparatus of FIG. 1.

In FIG. 4 a gate oxide 26 has been grown in the gate and device zone 27, as well as in the region of scribe line 25.

Figure 5:
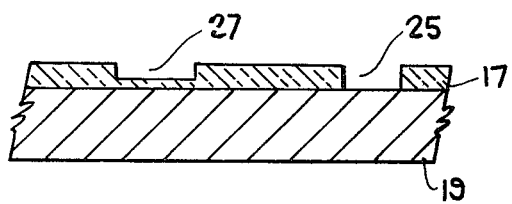
FIG. 5 is a side sectional view of a second masking step used in the construction of the apparatus of FIG. 1.

In FIG. 5, another masking step has opened the scribe line region 25 for establishing a contact to the substrate, known as a buried contact. The buried contact will extend into the scribe line region, although the buried contact may be omitted in certain devices, such as CMOS devices. Depletion masking and ion implant steps are now carried out, but are not shown.

Figure 6:
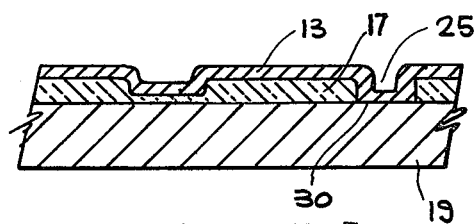
FIG. 6 is a side sectional view of a silicon deposition step used in the construction of the apparatus of FIG. 1.

In FIG. 6, a polysilicon layer 13 has been deposited over the entire wafer. The polysilicon layer 13 makes contact with the substrate at region 30 with a vertical edge in the scribe line zone 25 and thus covers an edge of oxide layer 17, thereby isolating it from ionic contaminants.

Figure 7:
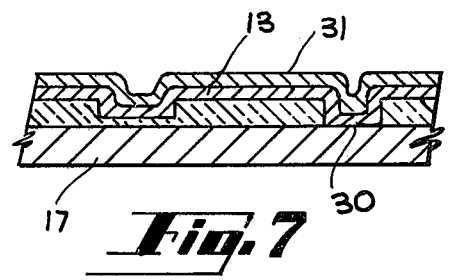
FIG. 7 is a side sectional view of an oxidation layer used in the construction of the apparatus of FIG. 1.

FIG. 7 shows the next step which consists of growing a layer of oxide 31 over the entire surface of the wafer. This oxide is used as a masking oxide for removing polysilicon from the center of scribe line 25 and other areas as shown in FIG. 8.

Figure 8:
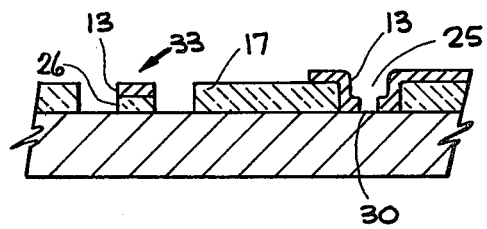
FIG. 8 is a side sectional view of a third mask for establishing gates used in the construction of the apparatus of FIG. 1.

In FIG. 8, another masking step is performed for formation of the gate region 33 and selectively removing polysilicon. During this masking step the oxide layer 31 has been selectively removed, and then the polysilicon layer 13 is removed from the regions surrounding the gate 33 and part of the scribe line area. The gate 33 consists of polysilicon 13 over gate oxide 26. At the same time, near the region 30, the polysilicon layer 13 is left extending into the scribe line zone 25 from the top of thermal layer 17, extending towards the gate 33 by a distance approximately equal to the width of the gate structure, or approximately six micrometers.

Figure 9:
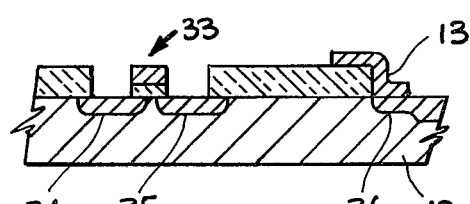
FIG. 9 is a side sectional view of a phosphorous deposition for establishing active circuit areas used in the construction of the apparatus of FIG. 1.

In FIG. 9, phosphorous atoms, designated n+ impurities, are introduced into the substrate 19 for forming active circuit areas. Specifically, a first doped region 34 forms a source for an MOS device, while a second n+ region 35 forms a drain for an MOS device. Both source and drain are formed at the same time. Phosphorous dopant material, at a concentration of $10^{18}$ to $10^{21}$ atoms per cubic centimeter, is also disposed below the polycrystalline layer 13 in those areas opened by buried contact by diffusing it through the layer, for forming a subsurface member 36 of the barrier structure of the present invention within the substrate 19.

Figure 10:
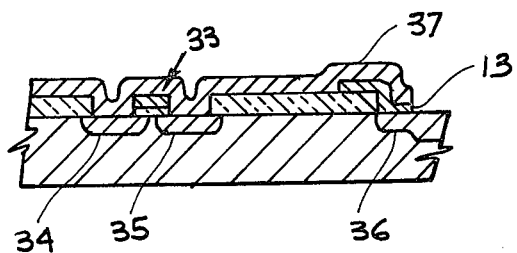
FIG. 10 is a side sectional view of a phosphorous doped oxide deposition used in the construction of the apparatus of FIG. 1.

FIG. 10 shows the deposition of a phosphorous doped oxide (PVX) layer 37 over the exposed gate and covering the active circuit regions.

Figure 11:
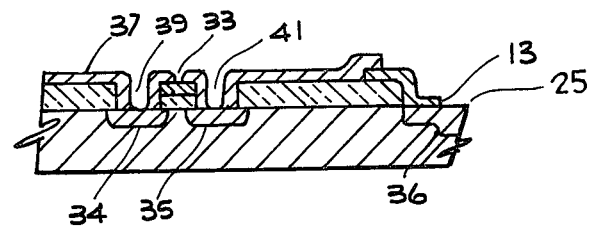
FIG. 11 is a side sectional view of a fourth masking step for establishing contacts used in the construction of the apparatus of FIG. 1.

In FIG. 11, a mask is applied to the wafer and cuts are made into the PVX layer 37 in regions 39 and 41 for contacting active circuit areas 34 and 35, and in the region 25 over the scribe line.

Figure 12:
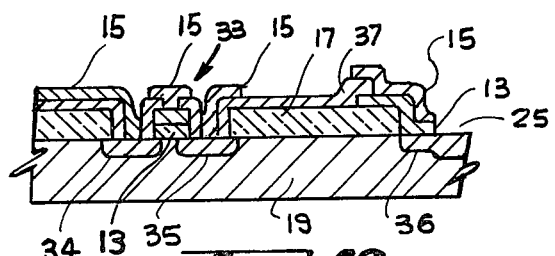
FIG. 12 is a side sectional view of a fifth masking for establishing metalization, including aluminum deposition used in the construction of the apparatus of FIG. 1.

In FIG. 12, a metal layer 15 is applied to make contact into diffused regions such as 34 and 35, and/or into polysilicon 13 of gate region 33. The metal layer 15, which may be aluminum, covers the polysilicon layer 13 near the scribe line zone 25. However, the lateral vertical edges of polysilicon layer 13 and metal layer 15 face scribe line 25 forming a 2-layer barrier structure providing an effective block to ion migration from the scribe line.

FIG. 12 reveals that the scribe line barrier of the present invention comprises a surface layer 13 of polysilicon which extends from the surface of the substrate 19 and extends toward the active circuit areas slightly and then goes upwardly covering a portion of the thermal oxide layer 17. A second barrier member is the metalization member 15 which extends from the left edge of the scribe line region 25 inwardly toward the active circuit region near gate 33 and also extends upwardly over the silicon region 13 and over a portion of the PVX layer 37. A third barrier member is below the surface of the substrate 19 and consists of the doped region 36 which is generally aligned with the lower regions of the barrier 13.

Figure 13:
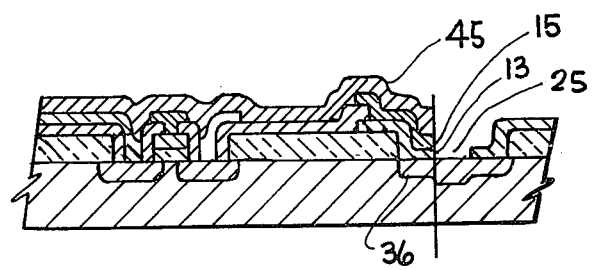
FIG. 13 is a side sectional view of a protective covering for the integrated circuit used in the construction of the apparatus of FIG. 1.

FIG. 13 shows completion of the integrated circuit structure wherein a protective layer 45 has been applied over the entire integrated circuit chip. Layer 45 is typically a silicon dioxide or glass layer which is approximately 1.0 micrometers thick. The glass layer 45 extends out to the region of the scribe line over the other barrier members, thus forming a fourth component for the barrier member. The glass member 45 keeps contaminants from entering the top structure. Thus, complete contaminant protection is provided for an integrated circuit chip with both edge protection provided by the barrier consisting of the subsurface doped region 36, the polysilicon layer 13 and the aluminum components 15 covered by the glass layer 45.

It will be apparent that the construction of the barrier structure herein has been described with reference to N channel MOS structures. However, it will be readily appreciated that the same construction applies to P-channel MOS structures. With some modification, the same structure is applicable to CMOS structures. Those skilled in the art will also appreciate that the same concept can be applied to other integrated circuit constructions, such as bi-polar and integrated injection logic. Furthermore, the sequence of processing steps is not significant and may be modified by those skilled in the art.

The two layer barrier of the present invention successfully retards ionic contamination of active circuit regions defined within an area demarcated by scribe lines of an integrated circuit die to a far greater extent than glass passivation layers, which primarily retard dirt particles or moisture, or other edge structures of the prior art which allow ion penetration.

What is claimed is:

1. In a semiconductor integrated circuit die construction within which circuits are defined, including a thermal oxide layer immediately over portions of a substrate, inward from scribe line zones where the substrate is exposed, the improvement comprising, a protective ion barrier forming lateral edges of the die, said edge barrier having a lower layer extending from a substrate surface upwardly, adjacent to scribe line zones where the substrate is exposed, at least as high as the thermal oxide layer disposed upon said substrate and an upper layer immediately covering said lower layer at least in said scribe line zones, said upper and lower ion barrier layers made of different materials, wherein the upper layer of said protective barrier is a metal layer, the lower layer being a layer of polysilicon, each layer resisting ion contamination past the material thereby protecting said die from edgewise ion migration.

2. The improved construction of claim 1 wherein said metal layer is aluminum.

3. In semiconductor integrated circuit wafers of the type comprising a plurality of dice formed on a substrate with at least a thermal oxide layer disposed immediately above the substrate, inward of scribe line zones, with a lateral die perimeter above the substrate defined by the scribe line zones extending from the substrate upwardly exposing the substrate an improved construction comprising, a protective ion barrier forming lateral die edges, completely around the lateral perimeter of each die, said edge barrier having a lower polysilicon layer extending from the substrate surface upwardly, adjacent to scribe line zones where the substrate is exposed at least as high as a thermal oxide layer disposed upon said substrate and an upper layer immediately covering said lower layer at least in said scribe line zones, said upper and lower ion barrier layers made of different materials, each of which resists ionic contamination past the material, wherein the upper layer of said protective barrier is a metal layer, thereby protecting said die from edgewise ion migration.

4. The improved construction of claim 3 wherein said metal layer is aluminum.

* * * * *